United States Patent [19]

Nagano et al.

[11] 4,293,370

[45] Oct. 6, 1981

[54] METHOD FOR THE EPITAXIAL GROWTH OF BORON PHOSPHOROUS SEMICONDUCTORS

[75] Inventors: Katsuto Nagano, Yokohama; Kazuhiko Ihaya, Tokyo; Syozo Sasa, Ichikawa; Takeshi Nakada, Tokyo, all of Japan

[73] Assignee: TDK Electronics Co., Ltd., Tokyo, Japan

[21] Appl. No.: 120,993

[22] Filed: Feb. 13, 1980

Related U.S. Application Data

[63] Continuation of Ser. No. 6,220, Jan. 24, 1979, abandoned, which is a continuation-in-part of Ser. No. 806,858, Jun. 15, 1977, abandoned.

[51] Int. Cl.³ .............................................. C30B 25/10
[52] U.S. Cl. ..................................... 156/612; 156/613
[58] Field of Search .................... 156/613, 614, 612; 148/175; 428/448; 427/86

[56] References Cited

U.S. PATENT DOCUMENTS

| | | | |
|---|---|---|---|
| 3,218,205 | 11/1965 | Ruchuwein | 156/614 |
| 3,721,573 | 3/1973 | Hays et al. | 148/175 |
| 3,877,060 | 4/1975 | Shono et al. | 148/175 |

FOREIGN PATENT DOCUMENTS

4676577 6/1973 Japan ................................. 156/614

*Primary Examiner*—Hiram Bernstein
*Attorney, Agent, or Firm*—Burgess, Ryan and Wayne

[57] ABSTRACT

The epitaxial growth of boron-phosphorous semiconductors can be accomplished by chemically reacting the gas materials diborane and phosphorous trichloride. The preferable temperature of the substrate in 880° C.–1,110° C. and the preferable ratio of the phosphorous trichloride to diborane in mol is 2–200. Use is made of a composite substrate.

4 Claims, 1 Drawing Figure

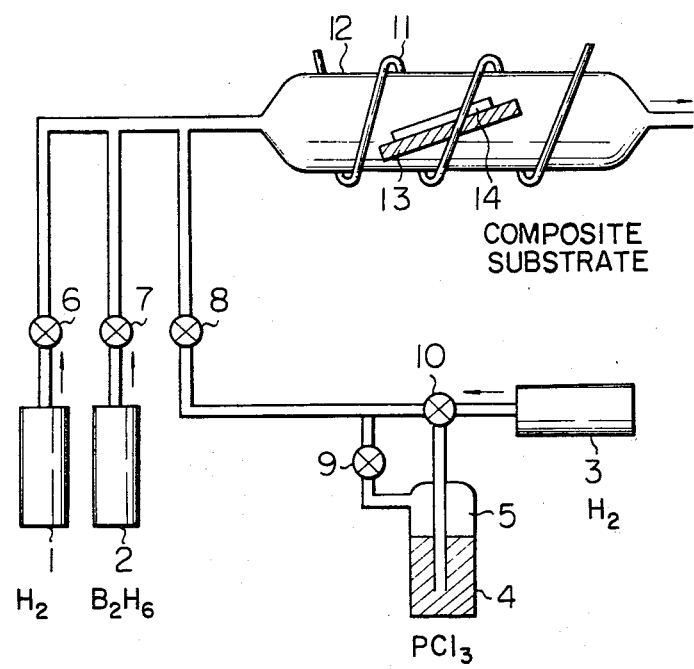

METHOD FOR THE EPITAXIAL GROWTH OF BORON PHOSPHOROUS SEMICONDUCTORS

CROSS-REFERENCE TO RELATED APPLICATIONS

This is a continuation of application Ser. No. 6,220, filed Jan. 24, 1979, now abandoned, which is a CIP of Ser. No. 806,858 filed June 15, 1977, now abandoned.

BACKGROUND OF THE INVENTION

The present invention relates to a process for epitaxially growing boron phosphide (BP) semiconductor layers on single crystal substrates using diborane ($B_2H_6$) and phosphorous trichloride ($PCl_3$).

It has been known, heretofore, that epitaxial films of boron phosphide semiconductors can be grown on single crystal substrates by using a hydride system of diborane ($B_2H_6$) and phosphine ($PH_3$) or a halide system of boron tribromide ($BBr_3$) and phosphorous trichloride ($PCl_3$).

The process of epitaxial growth in which the hydride system is used is disadvantageous in that it is very difficult to operate with safety and is expensive in respect to raw materials because it requires the use of a relatively large amount of phosphine in relation to diborane. The process of epitaxial growth in which the halide system is used has the disadvantage in the production process that control of the thickness of the deposited layers is difficult because the supply of boron is provided by vaporization of liquid boron tribromide.

Further, the latter prior art which utilizes $BBr_3$ and $PCl_3$ has the disadvantage that the carrier density of the product is not satisfactory. There has been a report teaching that $BBr_3$ and $PCl_3$ can provide a carrier density of only $2 \times 10^{19}$–$2.5 \times 10^{20}$ cm$^{-3}$, in which the conditions of the experiment are: etching temperature is 1230° C., HCl gas concentration 1.5 mol %, growth temperature 1050° C., $BBr_3$ flow rate $1.5 \times 10^{-4}$ mol/min, $PCl_3$ flow rate $3.7 \times 10^{-4}$ mol/min and $H_2$ flow rate is $4.0 \times 10^{-2}$ mol/min.

SUMMARY OF THE INVENTION

It is an object of the present invention to provide a novel process for the growth of boron phosphide semiconductors on single crystal substrates.

Another object of the present invention is to provide the boron phosphorous semiconductors in which the carrier density is less than that of the prior art.

The process of the present invention is based on the discovery that boron phosphide semiconductor layers of high quality can be epitaxially grown on single crystal substrates when diborane is used as a source of boron (B), and phosphorous trichloride is used as a source of phosphorous (P).

BRIEF DESCRIPTION OF THE DRAWING

FIG. 1 is a diagrammatic view of an apparatus for use in the process for the epitaxial growth of boron phosphorous semiconductors according to the present invention.

DETAILED DESCRIPTION OF THE INVENTION

Phosphorous trichloride is less toxic, can be more safely handled, and is less expensive than the phosphine.

The boron phosphide semiconductor layer obtained by the vapor growth process of the present invention is clear and yellowish brown in color and has a smooth surface. Reflection electron diffraction indicated that the boron phosphide semiconductor layer represented the Kikuchi band and, thus, it had very good crystallographic properties.

Since the controlling factor for the growth rate of the boron phosphide semiconductor layer is diborane, it is possible to accurately control the thickness of the layer merely by controlling a feed of the diborane.

The single crystal substrate used in the present invention can be an insulating substrate such as silicon (Si), germanium (Ge), silicon carbide (SiC), sapphire ($Al_2O_3$) or spinel ($Mg_lO_4$). A composite semiconductor substrate comprising a single crystal having thereon a boron phosphide crystal layer which has been preliminarily formed by a hydride system may also be used. The index of a plane which is used is (100), (110) and (111) with the (100) plane being preferred. A boron phosphide semiconductor layer formed on the (100) plane possesses most excellent carrier density properties.

Particularly, it was found that a BP/Si composite semiconductor substrate comprising a silicon substrate having boron phosphide deposited thereon produced excellent crystallographic properties over a wide range of the growth conditions of the present invention.

If no impurity is added, the boron phosphide semiconductor layer of the present invention exhibits an N-type conductivity. The semiconductor layer grown at a temperature of 880° to 1100° C. is of single crystal form. Also, the semiconductor layer grown at a temperature of 950° to 1050° C. and in the constituent molar ratio of phosphorous trichloride to diborane ($PCl_3/B_2H_6$ ratio) of 200 to 2 is of single crystal form. However, the single crystal obtained at a temperature of 950° to 1050° C. and in the $PCl_3/B_2H_6$ ratio of no less than 10 is excellent in both crystallographic properties and electrical properties (for instance, mobility).

The carrier gas used in the process of the present invention can by hydrogen, inert gases or mixtures thereof.

The diborane is used in a concentration of $2 \times 10^{-6}$ to $5 \times 10^{-3}$ mol/mm in a reaction gas.

The present invention will be further illustrated by the following examples.

EXAMPLE 1

Referring to FIG. 1, a silicon substrate 14 of a phosphorus (P) doped N-type having a resistivity of 10 Ohm-cm and an index of a plane of (100) was placed on a SiC coated carbon susceptor (13). Then, a cock (6) was opened to introduce a hydrogen carrier gas into a reactor (12) from a hydrogen bomb (1).

The SiC coated carbon susceptor (13) was induction heated by applying high frequency electric current to a water-cooled work coil (11) to maintain the substrate (14) at a temperature of 950° C. A cock (7) was opened to introduce diborane ($B_2H_6$) diluted with hydrogen into the reactor from a bomb (2). The concentration of diborane was $2 \times 10^{-5}$ mol/mm. At the same time, hydrogen was introduced into a bubbler (5) filled with liquid phosphorous trichloride ($PCl_3$) (4) from a bomb (3) by operating a trigonal cock (10) and a cock (9) and the hydrogen was bubbled therein and the resulting gas was introduced into the reactor 12 via a cock (8). In this case, the constituent ratio of phosphorus trichloride to diborane ($PCl_3/B_2H_6$) was 25. The concentration of the phosphorus trichloride was controlled by varying the flow rate of the hydrogen carrier gas to be bubbled and the temperature of the liquid phosphorus trichloride from the outside thereby varying the vapor pressure of the phosphorus trichloride. A boron phosphide semiconductor thus grown had a thickness of $2\mu$.

The grown layer had a mirror-like smooth surface and was found to have good crystallographic properties by reflection electron diffraction. The semiconductor layer was of N-type conductivity. A Hall measurement revealed that it had a carrier density of $3 \times 10^{19}$ cm$^{-3}$ and a mobility of 4 cm$^2$/V. sec.

EXAMPLE 2

A BP/Si composite semiconductor substrate was used as a single crystal semiconductor substrate. The substrate was composed of an N-type silicon substrate having a boron phosphide single crystal layer on the (100) plane thereof which was formed by a hydride system of phosphine (PH$_3$) and diborane (B$_2$H$_6$). The single crystal layer had a thickness of 500 to 10,000 Å. The single crystal layer had a mirror-like smooth surface. Reflection electron diffraction indicated that the single crystal layer exhibited a streak and a Kikuchi pattern and it had excellent crystallographic properties.

By the same procedure as that described in Example 1, a boron phosphide semiconductor layer was grown at a thickness of $5\mu$ on the above-mentioned BP/Si composite semiconductor substrate under conditions such that the growing temperature was 1050° C., the concentration of diborane was $1 \times 10^{-4}$ mol/mm and the ratio of PCl$_3$/B$_2$H$_6$ was 20. The grown layer so obtained had a mirror-like and smooth surface and was found to have good crystallographic properties by means of reflection electron diffraction. The semiconductor layer was of N-type conductivity. A Hall measurement revealed that it had a carrier concentration of $3 \times 10^{17}$ cm$^{-3}$ and a mobility of 12 cm$^2$/V. sec.

EXAMPLE 3

As a single crystal semiconductor substrate, there was used a composite semiconductor substrate of the same structure as that of the substrate described in Example 1 except that the silicon substrate was coated with a silicon dioxide (SiO$_2$) film 1 $\mu$m thick on the side and back surface thereof. By the same procedure as that described in Example 1, a boron phosphide semiconductor layer was grown to a thickness of $5\mu$ on the above-mentioned composite substrate under conditions such that the growing temperature was 1050° C., the concentration of diborane was $1 \times 10^{-4}$ mol/mm and the ratio of PCl$_3$/B$_2$H$_6$ was 20. The grown layer so obtained had a mirror-like and smooth surface and was found to have good crystallographic properties by means of reflection electron diffraction. The semiconductor layer was of N-type conductivity. A Hall measurement revealed that it had a carrier concentration of $8 \times 10^{16}$ cm$^{-3}$ and a mobility of 15 cm$^2$/V. sec.

Among the above three experiments, as far as the carrier density is concerned, only experiments 2 and 3 have the better carrier density than that of the prior art of BBr$_3$ and PCl$_3$. The important feature of the experiments 2 and 3 is the utilization of a composite substrate.

It is apparent from the foregoing examples that when a boron phosphide semiconductor layer is epitaxially grown on a crystal growing substrate using a reaction gas system consisting mainly of diborane and phosphorous trichloride in the formation of the boron phosphide semiconductor layer, the resulting boron phosphide semiconductor layer is excellent in both crystallographic properties and electrical properties. Accordingly, it is believed that the present invention will largely contribute to the industrial production of boron phosphide semiconductor elements.

From the foregoing it will now be apparent that a new and improved method for growing a boron phosphorous semiconductor has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A process for the epitaxial growth of boron phosphorous semiconductors having improved carrier density comprising the steps of growing the boron phosphorous semiconductors on an N-type silicon substrate having a single crystal layer, at a temperature of 880° C. to 1110° C., using a reaction gas consisting mainly of diborane and phosphorous trichloride, the constituent ratio of phosphorous trichloride to diborane being 2 to 200 in mol, and the concentration of the diborane being $2 \times 10^{-6}$ to $5 \times 10^{-3}$ mol/mm, wherein said substrate is a composite substrate having an N-type silicon substrate with a boron phosphide single crystal layer on the (100) plane thereof and said boron phosphide single crystal layer being formed by a hydride system of phosphine (PH$_3$) and diborane (B$_2$H$_6$).

2. The invention as defined in claim 1, wherein said temperature is 1050° C., said ratio is 20, the concentration of the diborane is $1 \times 10^{-4}$ mol/mm, and the thickness of said boron phosphide single crystal layer is 500–10,000 Å.

3. A process for the epitaxial growth of boron phosphorous semiconductors having improved carrier density comprising the steps of growing the boron phosphorous semiconductors of an N-type silicon substrate having a single crystal layer, at a temperature of 880° C. to 1110° C., using a reaction gas consisting mainly of diborane and phosphorous trichloride, the constituent ratio of phosphorus trichloride to diborane being 2 to 200 in mol, and the concentration of the diborane being $2 \times 10^{-6}$ to $5 \times 10^{-3}$ mol/mm, wherein said substrate is a composite substrate having a silicon substrate covered with a silicon dioxide film of approximately 1 $\mu$m thickness.

4. The invention as defined in claim 1, wherein said temperature is 1050° C., said ratio is 20, the concentration of the diborane is $1 \times 10^{-4}$ mol/mm.

* * * * *

UNITED STATES PATENT AND TRADEMARK OFFICE
CERTIFICATE OF CORRECTION

PATENT NO. : 4,293,370
DATED : October 6, 1981
INVENTOR(S) : Katsuto Nagano, et al It is certified that error appears in the above—identified patent and that said Letters Patent is hereby corrected as shown below:

Column 2, line 13: "$(Mgl_2O_4)$" should be --$(M_gAl_2O_4)$--.

*Signed and Sealed this*

*Seventh* Day of *December 1982*

[SEAL]

*Attest:*

GERALD J. MOSSINGHOFF

*Attesting Officer*     *Commissioner of Patents and Trademarks*